US007674680B2

(12) United States Patent
Snyder et al.

(10) Patent No.: US 7,674,680 B2
(45) Date of Patent: Mar. 9, 2010

(54) TRANSISTOR HAVING HIGH DIELECTRIC CONSTANT GATE INSULATING LAYER AND SOURCE AND DRAIN FORMING SCHOTTKY CONTACT WITH SUBSTRATE

(75) Inventors: John P. Snyder, Edina, MN (US); John P. Larson, Northfield, MN (US)

(73) Assignee: Avolare 2, LLC, Chapel Hill, NC (US)

( * ) Notice: Subject to any disclaimer, the term of this patent is extended or adjusted under 35 U.S.C. 154(b) by 0 days.

(21) Appl. No.: 10/958,627

(22) Filed: Oct. 5, 2004

(65) Prior Publication Data

US 2005/0106821 A1 May 19, 2005

Related U.S. Application Data

(63) Continuation of application No. 10/215,447, filed on Aug. 9, 2002, now Pat. No. 6,949,787, which is a continuation-in-part of application No. 09/928,124, filed on Aug. 10, 2001, now abandoned, which is a continuation of application No. 09/928,163, filed on Aug. 10, 2001, now abandoned.

(60) Provisional application No. 60/381,320, filed on May 16, 2002.

(51) Int. Cl.
*H01L 21/336* (2006.01)
(52) U.S. Cl. ................. 438/287; 438/591; 438/783; 438/785; 438/765
(58) Field of Classification Search ................ 257/287, 257/591, 783, 785, 765
See application file for complete search history.

(56) References Cited

U.S. PATENT DOCUMENTS 4,053,924 A   10/1977   Roman et al.
4,300,152 A   11/1981   Lepselter
4,485,550 A *  12/1984   Koeneke et al. ............. 438/233
4,513,309 A    4/1985   Cricchi
4,554,569 A   11/1985   Tove et al.
RE32,613 E    2/1988   Lepselter et al.
4,780,429 A   10/1988   Roche et al.
4,942,441 A    7/1990   Konishi et al.
5,040,034 A    8/1991   Murakami et al.
5,079,182 A    1/1992   Ilderem et al.

(Continued)

FOREIGN PATENT DOCUMENTS

EP   0 603 102 A2   6/1994
JP      06097109    4/1994
JP      2000124329  4/2000
WO   WO 01 45157   6/2001

OTHER PUBLICATIONS

Lepselter, M.P., Sze, S.M. *SB-IGFET: An Insulated Gate Field Effect Transistor Using Schottky Barrier Contacts for Source and Drain.* Proceedings of the IEEE, Aug. 1968; pp. 1400-1402.

Lepselter, M.P., Macrae, A.U., MacDonald, R.W. *SB-IGFET, II: An Ion Implanted IGFET Using Schottky Barriers.* Proceedings of the IEEE, May 1969; pp. 812-183.

(Continued)

*Primary Examiner*—Long Pham
(74) *Attorney, Agent, or Firm*—David J. King; Lemaire Patent Law Firm, P.L.L.C.

(57) ABSTRACT

The invention is directed to a device for regulating the flow of electric current with high dielectric constant gate insulating layer and a source and/or drain forming a Schottky contact or Schottky-like region with a substrate and its fabrication method. In one aspect, the gate insulating layer has a dielectric constant greater than the dielectric constant of silicon. In another aspect, the current regulating device may be a MOSFET device, optionally a planar P-type or N-type MOSFET, having any orientation. In another aspect, the source and/or drain may consist partially or fully of a silicide.

53 Claims, 12 Drawing Sheets

U.S. PATENT DOCUMENTS

| | | | |
|---|---|---|---|
| 5,250,834 | A | 10/1993 | Nowak |
| 5,323,053 | A | 6/1994 | Luryi et al. |
| 5,338,698 | A | 8/1994 | Subbanna |
| 5,361,225 | A | 11/1994 | Ozawa |
| 5,444,302 | A | 8/1995 | Nakajima et al. |
| 5,663,584 | A | 9/1997 | Welch |
| 5,665,993 | A | 9/1997 | Keller et al. |
| 5,760,449 | A | 6/1998 | Welch |
| 5,767,557 | A | 6/1998 | Kizilyalli |
| 5,801,398 | A | 9/1998 | Hebiguchi |
| 5,883,010 | A | 3/1999 | Merrill et al. |
| 6,037,605 | A | 3/2000 | Yoshimura |
| 6,130,750 | A | 10/2000 | Ausschnitt et al. |
| 6,160,282 | A | 12/2000 | Merrill |
| 6,268,636 | B1 | 7/2001 | Welch |
| 6,303,479 | B1 | 10/2001 | Snyder |
| 6,323,528 | B1 | 11/2001 | Yamazaki et al. |
| 6,353,251 | B1 | 3/2002 | Kimura |
| 6,413,829 | B1 | 7/2002 | Yu |
| 6,420,742 | B1 | 7/2002 | Ahn et al. |
| 6,486,080 | B2 * | 11/2002 | Chooi et al. ............... 438/785 |
| 6,495,882 | B2 | 12/2002 | Snyder |
| 6,509,609 | B1 | 1/2003 | Zhang et al. |
| 6,555,879 | B1 | 4/2003 | Krivokapic et al. |
| 2001/0024847 | A1 | 9/2001 | Snyder |
| 2002/0030231 | A1 | 3/2002 | Okawa et al. |

OTHER PUBLICATIONS

Kisaki, Hitoshi. *Tunnel Transistor*. Proceedings of the IEEE, Jul. 1973; pp. 1053-1054.

Koeneke, C.J., Sze, S.M., Levin, R.M., Kinsbron, E. Schottky MOSFET for VLSI . *IEDM*, 1981; pp. 367-370.

Sugino, M., Akers, L.A., Rebeschini, M.E. CMOS Latch-Up Elimination Using Schottky Barrier PMOS. *IEDM*, 1982; pp. 462-465.

Koeneke, C.J., Lynch, W.T. Lightly Doped Schottky MOSFET. *IEDM*, 1982; pp. 466-469.

Mochizuki, T., Wise, K.D. An n-Channel MOSFET with Schottky Source and Drain. *IEEE Electron Device Letters*, EDL-5, No. 4, Apr. 1984; pp. 108-111.

Oh, C.S., Koh, Y.H., Kim, C.K. A New P-Channel MOSFET Structure with Schottky Clamped Source and Drain, *IEDM*, 1984; pp. 609-612.

Swirhun, Stanley E., et al. A VLSI Suitable Schottky Barrier CMOS Process. *IEEE Transactions on Electron Devices*, ED-32, No. 2, Feb. 1985; pp. 194-202.

Tove, P.A., Bohlin, K., Masszi, F., Norde, H., Nylander, J., Tiren, T., Magnusson, U. Complementary Si MESFET Concept Using Silicon-on-Sapphire Technology. *IEEE Electron Device Letters*, vol. 9, No. 1, Jan. 1988; pp. 47-49.

Tove, P.A., Bohlin, K.E., Norde, H., Magnusson, U., Tiren, J., Soderbarg, A., Rosling, M., Masszi, F., Nyander, J. *Silicon IC Technology Using Complementory MESFETs*. Solid State Devices, Elsevier Science Publishers (North Holland), 1988; pp. 607-609.

Tsui, B., Chen, M. A Novel Process for High-Performance Schottky Barrier PMOS. *J. Electrochem Soc.*, vol. 136, No. 5, May 1989; pp. 1456-1459.

Misra, D., Simhadri, V.S. A Survey of the Potential of an IrSi Schottky Barrier MOSFET Based on Simulation Studies. *Solid State Electronics*, vol. 35, No. 6, 1992; pp. 829-833.

Hattori, Reiji, Nakae, Akihiro, Shirafuji, Junji. A New Type of Tunnel-Effect Transistor Employing Internal Field Emission of Schottky Barrier Junction. *Japan J. Appl. Phys.*, vol. 31, 1992; pp. L1467-L1469.

Hattori, Reiji, Shirafuji, Junji. Numerical Simulation of Tunnel Effect Transistors. *Japan J. Appl. Phys.*, vol. 33, 1994; pp. 612-618.

Tucker, J.R., Wang, C., Lyding, J.W., Shen, T.C., Abeln, G.C. Nanometer Scale MOSFETs and STM Patterning on Si. *SSDM 1994*, Aug. 1994; pp. 322-324.

Tucker, J.R., Wang, C., Carney, P.S. Silicon Field-Effect Transistor Based on Quantum Tunneling. *Applied Physics Letters*, vol. 65, No. 5, Aug. 1, 1994; pp. 618-620.

Kimura, Mitsuteru, Matsudate, Tadashi. A New Type of Schottky Tunnel Transistor. *IEEE Electron Device Letters*, EDL-15, No. 10, Oct. 1994, pp. 412-414.

Snyder, John P., Helms, C.R., Nishi, Yoshio. Experimental Investigation of a PtSi Source and Drain Field Emission Transistor. *Applied Physics Letters*, vol. 67, No. 10, Sep. 4, 1995; pp. 1420-1422.

Wolf, Stanley. *Silicon Processing for the VLSI Era*. vol. 3: The Submicron MOSFET, Lattice Press, Sunset Beach, CA, 1995; pp. 523-528.

Rishton, S.A., Ismail, K., Chu, J.O., Chan, K. A Mos Transistor with Schottky Source/Drain Contacts and a Self-Aligned Low-Resistance T-gate. *Microelectronics Engineering*, vol. 35, 1997; pp. 361-363.

Nishisaka, Mika, Asano, Tanemasa. Reduction of the Floating Body Effect in SOI MOSFETs by Using Schottky Source/Drain Contact. *Japan J. Appl. Phys.*, vol. 37, Mar. 1998; pp. 1295-1299.

Wang, C., Snyder, John P., Tucker, J.R. Sub-50nm PtSi Schottky Source/Drain p-MOSFETs. *56th Annual Device Research Conference Digest*, Jun. 1998, pp. 72-73.

Zhao, Q.T., Klinkhammer, F., Dolle, M., Kappius, L., Mantl, S. Nanometer Patterning of Epitaxial CoSi2/Si(100) for Ultrashort Channel Schottky Barrier Metal-Oxide-Semiconductor Field Effect Transistors. *Applied Physics Letters*, vol. 74, No. 3, Jan. 18, 1999; pp. 454-456.

Wang, C., Snyder, John P., Tucker, J.R. Sub-40nm PtSi Schottky Source-Drain Metal-Oxide-Semiconductor Field-Effect-Transistors. *Applied Physics Letters*, vol. 74, No. 8, Feb. 22, 1999; pp. 1174-1176.

Snyder, John P., Holms, C.R., Nishi, Yoshio. Analysis of the Potential Distribution in the Channel Region of a Platinum Silicided Source/Drain Metal Oxide Semiconductor Field Effect Transistor. *Applied Physics Letters*, vol. 74, No. 22, May 31, 1999; pp. 3407-3409.

Saitoh, W., Yamagami, S., Itoh, A., Asada, M. 35nm Metal Gate SOI-p-MOSFETs with PtSi Schottky Source/Drain. *57th Annual Device Research Conference Digest*, Jun. 1999; pp. 30-31.

Tucker, J.R. Schottky Barrier MOSFETs for Silicon Nano-electronics. *IEEE Frontiers in Electronics*, Jan. 1997; pp. 97-100.

Laplante, Philip A. (Editer-in-Chief). *Comprehensive Dictionary of Electrical Engineering*. IEEE Press, 1999, p. 97.

Muller, Richard S. and Kamins, Theodore I. *Device Electronics for Integrated Circuit*. John Wiley & Sons, Second Edition, 1977, 1986, pp. 448,505-511.

Pierret. Modular Series on Solid State Devices, vol. I Semiconductor Fundamentals, Addison-Wesly, 1983; pp. 29-33.

Neudeck, Gerold W. vol. II: *The PN Junction Diode*, Modular Series on Solid State Devices. Addison-Wesley, 1983; pp. 8-10.

On-line Encyclopedia Britannica, 2001, definition of "rare-earth element.", date not established; 2 pages.

SZE, S.M. *Physics of Semiconductor Devices*. John Wiley & Sons, Second Edition, 1981; pp. 293-294.

Calvet, L. E., Luebben, H., Reed, M.A., Wang, C., Snyder, J.P., and Tucker, J.R. Subthreshold and scaling of PtSi Schottky barrier MOSFETs, 2000 Academic Press, *Superlattices and Microstructures*, vol. 28, No. 5/6; pp. 501-506.

Wolf, Stanley. *Silicon Processing for the VLSI Era, vol. 3: The Submicron MOSFET*. Lattice Press, 1995; pp. 183-187.

Web page "provided by Laurie Calvet", "Device Physics of the SBMOSFET", http://www.eng.yale.edu/reedlab/research/semicond.html, date not established; 7 pages.

Winstead, B. and Ravaioli, U. Simulation of Schottky Barrier MOSFET's with a Coupled Quantum Injection/Monte Carol Technique. *IEEE Transactions on Electron Device*, vol. 47, No. 6, Jun. 2000; pp. 1241-1246.

Gang, D., Xiaoyan, L., Lei, S., Jiaping, Y., Ruqi, H., Houlet, P., and Fujitan, H. Monte Carol Simulation of 50nm n-Channel Schottky Barrier Tunneling Transistors. *Chinese Journal of Electronics*, vol. 11, No. 2, Apr. 2002; pp. 200-203.

Rishton, S.A., Ismail, K., Chu, J.O., Chan, K.K., Lee, K.Y. New Complimentary metal-oxide semiconductor technology with self-aligned Schottky source/drain and low-resistance T gates. *J. Vac. Sci. Technol. B*, 15(6), Nov./Dec. 1997, pp. 2795-2798.

Kedzierski, J., Xuan, P., Subramanian, V., Bokor, J., King, T-J., Hu, C., Anderson, E. A 20 nm gate-length ultra-thin body p-MOSFET with silicide source/drain. *Superlattices and Microstructures*, vol. 28, No. 5/6, 2000, pp. 445-452.

Magnusson, U. et al., Bulk Silicon Technology for Complementary MESFETs. *Electronics Letters*, vol. 25, No. 9, Apr. 27, 1989; pp. 565-566.

Random House College Dictionary, 1980, Random House, Inc., Revised Ed., pp. 17 and 1066.

International Technology Roadmap for Semiconductors 1999, US Copyright 1999 by Semiconductor Industry Association, Front End Processes section, p. 107.

S.M. Sze, *Physics of Semiconductor Devices*, 1981, John Wiley & Sons,, Second Edition, pp. 451-453.

Tu, K.N. Thompson, R.D., Tsaur, B.Y. Low Schottky Barrier of Rare-Earth Silicide on n-Si, *Applied Physics Letters*, vol. 38, No. 8, Apr. 1981; pp. 626-628.

Unewisse, M.H., Storey, J.W. V. Electrical and Infared Investigation of Erbium Silicide, *J. Appl. Phys.*, vol. 72, No. 6., Sep. 1992; pp. 2367-2371.

Geppert, Linda. The 100-Million Transistor IC. *IEEE Spectrum*, Jul. 1999; pp. 23-24.

Taur, Yuan. The Incredible Shrinking Transistor. *IEEE Spectrum*, Jul. 1999; pp. 25-29.

* cited by examiner 323
310
340
310

FIG. 5

TRANSISTOR HAVING HIGH DIELECTRIC CONSTANT GATE INSULATING LAYER AND SOURCE AND DRAIN FORMING SCHOTTKY CONTACT WITH SUBSTRATE

CROSS-REFERENCE TO RELATED APPLICATION(S)

This application is a continuation-in-part of U.S. patent application Ser. No. 09/928,124, filed Aug. 10, 2001 and of U.S. patent application Ser. No. 09/928,163, filed Aug. 10, 2001. This application claims further priority to U.S. provisional patent application No. 60/381,320, filed on May 16, 2002, which is incorporated by reference in its entirety.

BACKGROUND OF THE INVENTION

The present invention is directed to devices that regulate the flow of electric current and their fabrication methods. More specifically, the present invention is directed to Schottky-barrier source and/or drain transistors.

An electric current flow regulating device such as semiconductor device 100 (for example a transistor), seen in prior art FIG. 1, may include a silicon substrate 110, with an impurity doped source 120 and impurity doped drain 130. Source 120 and drain 130 are separated by a channel region 140. Atop the channel region 140 is an insulating layer 150. Insulating layer 150 typically consists of silicon dioxide, which has a dielectric constant of 3.9. A gate electrode 160, made from electrically conductive material, is located on top of the insulating layer 150.

When a voltage $V_G$ is applied to the gate electrode 160, current flows between the source 120 and drain 130 through the channel region 140. This current is referred to as the drive current, or $I_D$. For digital applications, a voltage $V_G$ can be applied to the gate electrode 160, to turn the semiconductor device 100 "on." In this state, the semiconductor device will have a relatively large drive current, ideally limited only by the resistance of the channel region 140. A different voltage $V_G$ can be applied to the gate electrode 160 to turn the semiconductor device 100 "off." In this state, the ideal leakage current is zero. However, in practical applications, the drive current in the "on" state is not ideal because of parasitic impedances associated with other parts of the semiconductor device 100. For example, the source and drain regions have a finite impedance, resulting in a parasitic impedance which adds to the resistance of the channel region. Also, in practical applications, there is a certain finite amount of leakage current when the semiconductor device is "off."

In prior art current regulating devices, the drive current is linearly proportional to the dielectric constant K of the insulating layer 150, and linearly inversely proportional to the thickness $T_{ins}$ of the insulating layer 150. The drive current $I_D$ is approximated by the relationship:

$$I_D \sim K/T_{ins}$$

where K is the dielectric constant of the insulating layer and $T_{ins}$ is the thickness of the insulating layer.

One consideration in the design of current regulating devices is reducing the amount of power required to achieve a desired drive current. One way to reduce power consumption is by using a metal source and drain and a simple, uniformly implanted channel dopant profile, as described in copending U.S. patent application Ser. No. 09/465,357, filed on Dec. 16, 1999, entitled "METHOD OF MANUFACTURING A SHORT-CHANNEL FET WITH SCHOTTKY BARRIER SOURCE AND DRAIN CONTACTS," and Ser. No. 09/777,536, filed on Feb. 6, 2001, entitled "MOSFET DEVICE AND MANUFACTURING METHOD," the contents of which are hereby incorporated by reference.

Another consideration in the design of current regulating devices is the manufacturability. One way to improve the manufacturability of current regulating devices having gate insulators with high dielectric constant materials is to form the source and drain electrodes using a low temperature process such as that used for formation of Schottky or Schottky-like source and drain electrodes, as described in U.S. Provisional Patent Application 60/381,320, filed on May 16, 2002, entitled "LOW TEMPERATURE SOURCE AND DRAIN FORMATION PROCESS STEPS FOR THE MANUFACTURE OF MOSFET DEVICES," the contents of which are hereby incorporated by reference.

There is a need in the art for a device for regulating the flow of electric current, which exhibits an improved drive current in the "on" state. There is a further need in the art for a method of manufacturing such a device at reduced temperatures.

BRIEF SUMMARY OF THE INVENTION

By using the invention disclosed herein the drive current characteristics can be improved, resulting in a non-linear relationship between the drive current $I_D$ and both the dielectric constant (K) of the insulating layer and the thickness of the insulating layer $T_{ins}$. The resulting relationship results in current regulating devices that are more sensitive to variations in K and $T_{ins}$ compared to the prior art. Furthermore, by using the invention disclosed herein, the manufacturability of new gate insulator materials is improved substantially.

In one aspect, the invention provides a method for manufacturing a device for regulating the flow of electrical current. The method includes the steps of providing for a semiconductor substrate; providing for an electrically insulating layer in contact with the semiconductor substrate, the insulating layer having a dielectric constant greater than 4.0; providing for a gate electrode in contact with at least a portion of the insulating layer; and providing a source electrode and a drain electrode in contact with the semiconductor substrate and proximal to the gate electrode wherein at least one of the source electrode and the drain electrode forms a Schottky contact or Schottky-like region with the semiconductor substrate. In one aspect, the device for regulating the flow of electrical current may be a Metal Oxide Semiconductor Field Effect Transistor (MOSFET) device. In another aspect, the dielectric constant may be greater than 7.6 or greater than 15.

In another aspect, the source and drain electrodes may be formed from a member of the group consisting of: platinum silicide, palladium silicide and iridium suicide. In another aspect, the source and drain electrodes may be formed from a member of the group consisting of the rare earth suicides. In another aspect, the insulating layer may be formed from a member of the group consisting of the metal oxides. In another aspect, the Schottky contact or Schottky-like region may be at least in areas adjacent to the channel. In another aspect, an entire interface between at least one of the source and the drain electrodes and the semiconductor substrate may form a Schottky contact or Schottky-like region with the semiconductor substrate. In another aspect, the channel region may be doped.

In another aspect, the invention provides a method for manufacturing a device for regulating the flow of electrical current. The method includes the steps of providing for a semiconductor substrate; providing for an electrically insulating layer in contact with the semiconductor substrate, the insulating layer having a dielectric constant greater than 4.0;

providing for a gate electrode located in contact with at least a portion of the insulating layer; exposing the semiconductor substrate on one or more areas proximal to the gate electrode; providing for a thin film of metal on at least a portion of the exposed semiconductor substrate; and reacting the metal with the exposed semiconductor substrate such that a Schottky or Schottky-like source electrode and a drain electrode are formed on the semiconductor substrate. In one aspect, the device for regulating the flow of electrical current may be a MOSFET device. In another aspect, the dielectric constant may be greater than 7.6 or greater than 15.

In another aspect, the gate electrode may be provided by the steps of depositing a thin conducting film on the insulating layer; patterning and etching the conducting film to form a gate electrode; and forming one or more thin insulating layers on one or more sidewalls of the gate electrode. In another aspect, the method may include the step of removing metal not reacted during the reacting process. In another aspect, the reacting may include thermal annealing. In another aspect, the source and drain electrodes may be formed from a member of the group consisting of: platinum silicide, palladium silicide and iridium silicide. In another aspect, the source and drain electrodes may be formed from a member of the group consisting of the rare earth suicides. In another aspect, the insulating layer may be formed from a member of the group consisting of metal oxides. In another aspect, the Schottky contact or Schottky-like region may be formed at least in areas adjacent to the channel. In another aspect, an entire interface between at least one of the source electrode and the drain electrode and the semiconductor substrate may form a Schottky contact or Schottky-like region with the semiconductor substrate. In another aspect, dopants may be introduced into the channel region.

In another aspect, the invention provides a device for regulating the flow of electrical current. The device includes a semiconductor substrate, a gate electrode, an electrically insulating layer located between the gate electrode and the semiconductor substrate, the insulating layer having a dielectric constant greater than 4.0, and a source electrode and a drain electrode in contact with the semiconductor substrate and proximal to the gate electrode wherein at least one of the source electrode and the drain electrode forms a Schottky contact or Schottky-like region with the semiconductor substrate. In one aspect, the device for regulating the flow of electrical current may be a Metal Oxide Semiconductor Field Effect Transistor (MOSFET) device. In another aspect, the dielectric constant may be greater than 7.6 or greater than 15.

In another aspect, the source and drain electrodes may be formed from a member of the group consisting of: platinum silicide, palladium silicide and iridium silicide. In another aspect, the source and drain electrodes may be formed from a member of the group consisting of the rare earth silicides. In another aspect, the insulating layer may be formed from a member of the metal oxides. In another aspect, the Schottky contact or Schottky-like region may be at least in areas adjacent to the channel. In another aspect, an entire interface between at least one of the source and the drain electrodes and the semiconductor substrate may form a Schottky contact or Schottky-like region with the semiconductor substrate. In another aspect, the channel region may be doped.

Aspects of the invention can include one or more of the following advantages. Conventional field effect transistors (FET) and other current regulating devices require a higher voltage than those fabricated in accordance with the invention to produce a similar drive current from source to drain. In an optimized conventional FET or current regulating device, the drive current varies generally linearly with the ratio of the insulating layer's dielectric constant to its thickness. One of the advantages of the invention is the unexpected result of the drive current being more sensitive to dielectric constant K than to $T_{ins}$, implying larger drive current $I_D$ for larger K and constant $K/T_{ins}$ ratio. These results are achieved by coupling a Schottky or Schottky-like source and/or drain with an insulating layer made of a high dielectric constant material. Lower voltage is required to produce high source to drain currents which results in lower power consumption for microelectronics utilizing this architecture.

Furthermore, the well-known benefit of achieving less gate leakage current (between gate and source/drain electrodes) by using larger K and constant $K/T_{ins}$ ratio, will still be observed in the present invention. For conventionally architected devices this particular benefit is the sole reason for using materials for the gate insulator having larger dielectric constants K than that of silicon dioxide, which has a dielectric constant of 3.9. These materials are denoted as "high K" materials. No other significant benefit is expected or observed. By using Schottky or Schottky-like source/drain devices in combination with a larger K, an unexpected and dramatic improvement in drive current $I_d$ is achieved in addition to the reduction in gate leakage current.

Although there is a strong motivation for the industry to adopt new high K gate insulator materials due to the problem of gate leakage current, there are technical obstacles that make production of high K gate insulators challenging. One of the most important problems is the degradation of the high K gate insulator materials during high temperature processing required for the formation of the impurity doped source and drain regions. This degradation is caused by reactions with neighboring materials such as the silicon in the channel region or the gate electrode. The processing steps for the formation of the Schottky or Schottky-like source/drain regions occur at much lower temperatures such as 400° C. as compared to 1000° C. required for impurity doped source and drain formation. As a result of the significantly lower temperature processing steps for the formation of the Schottky or Schottky-like source/drain regions, the high K materials do not react substantially with the neighboring materials. Therefore, another benefit of using Schottky or Schottky-like source/drain devices in combination with high K gate insulator materials is the improved manufacturability of high K gate insulators.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

BRIEF DESCRIPTION OF THE DRAWINGS

FIG. 5 is a cross-section of semiconductor substrate after ion implantation.

Like reference symbols in the various drawings indicate like elements.

DETAILED DESCRIPTION

Figure 1:
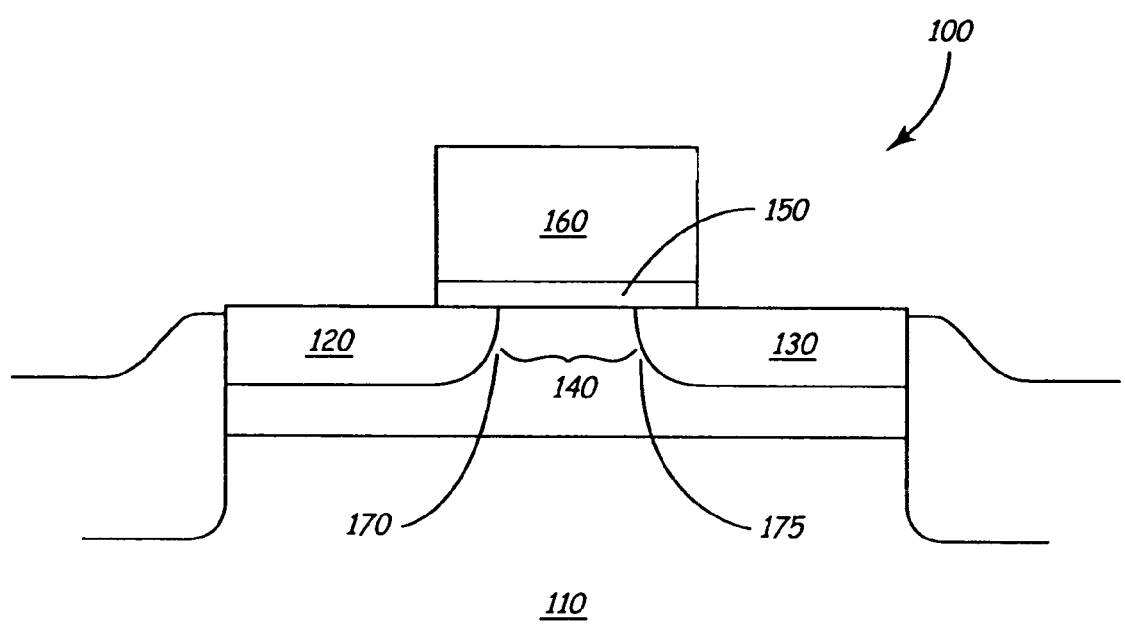
FIG. 1 is a cross-section of a prior art semiconductor transistor.
Figure 2:
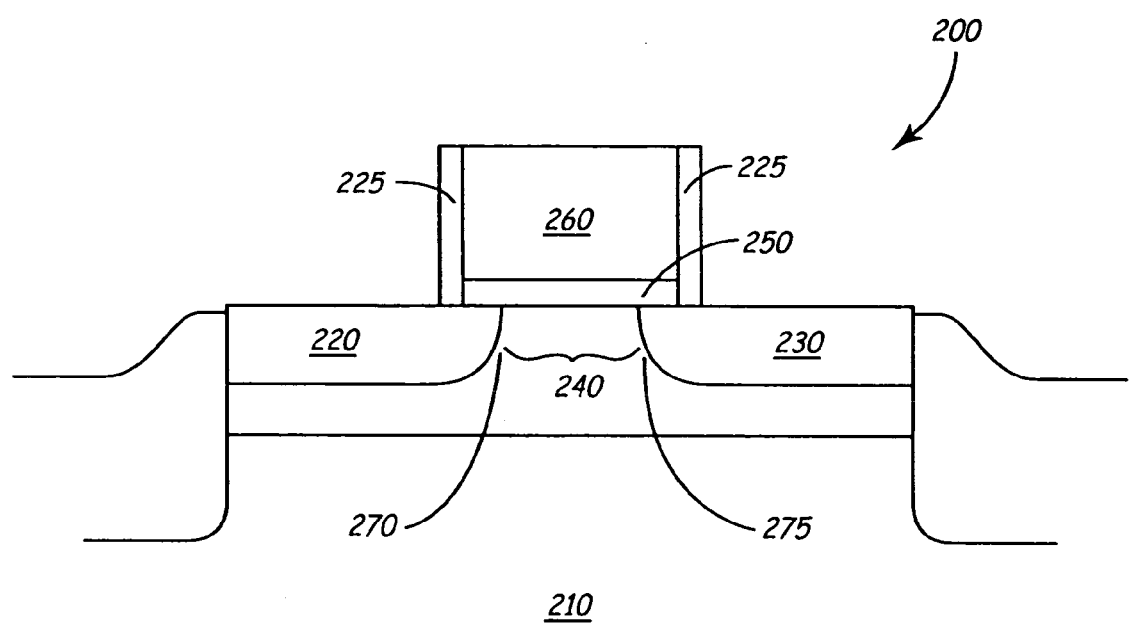
FIG. 2 is a cross-section of a semiconductor substrate with Schottky contact source and drain combined with a non-silicon dioxide insulating layer between the gate and channel region.

Referring to FIG. 2, semiconductor device 200 includes a substrate 210 in which a source 220 and drain 230 are formed. Substrate 210 may be composed of silicon or may be a silicon-on-insulator (SOI) substrate. Source 220 and/or drain 230 may be composed partially or fully of a rare earth silicide. Source 220 and/or drain 230 may also be composed partially or fully of platinum silicide, palladium silicide or iridium silicide. Because the source and drain are composed in part of a metal, they form Schottky contacts or Schottky-like regions 270, 275 with the substrate 210, where a "Schottky contact" is defined by the contact between a metal and a semiconductor, and a "Schottky-like region" is a region formed by the close proximity of a semiconductor and a metal. The Schottky contacts or Schottky-like regions 270, 275 can be formed by forming the source and/or drain from a metal silicide. The Schottky contacts or Schottky-like regions 270, 275 are in an area adjacent to a channel region 240 formed between the source 220 and drain 230. The entire interface between either or both of the source 220 and the drain 230 may form a Schottky contact or Schottky-like region 270, 275 with the substrate 210. The channel region 240 may be impurity doped where the doping may be conventional non-uniform doping or may be uniform doping as described in copending U.S. patent application Ser. No. 09/465,357 and U.S. patent application Ser. No. 09/777,536.

An insulating layer 250 is formed on top of the channel region 240 and may be formed on part or all of the source 220 and drain 230. The insulating layer 250 is composed of a material with a dielectric constant greater than that of silicon dioxide; e.g. a dielectric constant greater than 3.9. For example, insulating layer 250 may be composed of a metal oxide such as $TaO_2$ with a dielectric constant of approximately 25, $TiO_2$ with a dielectric constant of approximately 50-60, $HfO_2$ with a dialectic constant of approximately 15-20, or $ZrO_2$ with a dielectric constant of approximately 15-20. The insulating layer 250 may consist of a dielectric with a modest K value (e.g., 5-10), such as nitride/oxide or oxy-nitride stack; a medium K value (e.g., 10-20), such as unary oxides $Ta_2O_3$, $TiO_2$, $ZrO_2$, $HfO_2$, $Y_2O_3$, $La_2O_3$, $Gd_2O_3$, $Sc_2O_3$ or silicates $ZrSiO_4$, $HfSiO_4$, $LaSiO_4$, or $TiSiO_4$; or a high K value (e.g., greater than 20) such as amorphous $LaAlO_3$, $ZrTiO_4$, $SnTiO_4$, or $SrZrO_4$, or single crystals $LaAl_3O_4$, $BaZrO_3$, $Y_2O_3$, $La_2O_3$. Optionally, to improve manufacturability issues associated with transition metals, the insulating layer 250 may consist of more than one layer. The insulating layer 250 may be formed with a "bi-layer" approach and may consist of more than one type of dielectric, e.g., $TiO_2$ on top of $Si_3N_4$. A gate electrode 260 is positioned on top of the insulating layer 250. A thin insulating layer 225 surrounds the gate electrode 260.

By forming a semiconductor device with (1) a source 220 or drain 230 forming a Schottky contact or Schottky-like region 270, 275 with the substrate 110; and (2) an insulating layer 250 with a relatively high dielectric constant, one is able to achieve a larger drive current $I_D$ for larger K, but constant $K/T_{ins}$.

Figure 3A:
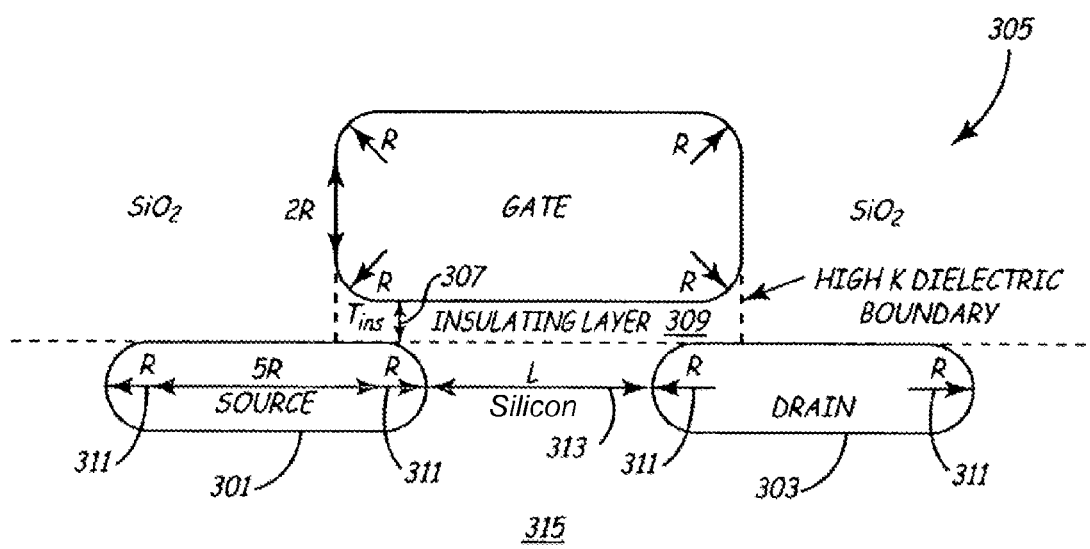
FIG. 3a is a cross-section of a semiconductor device with Schottky contact source and drain combined with a non-silicon dioxide insulating layer between the gate and channel region. This is the device structure used for numerical simulations.
Figure 3B:
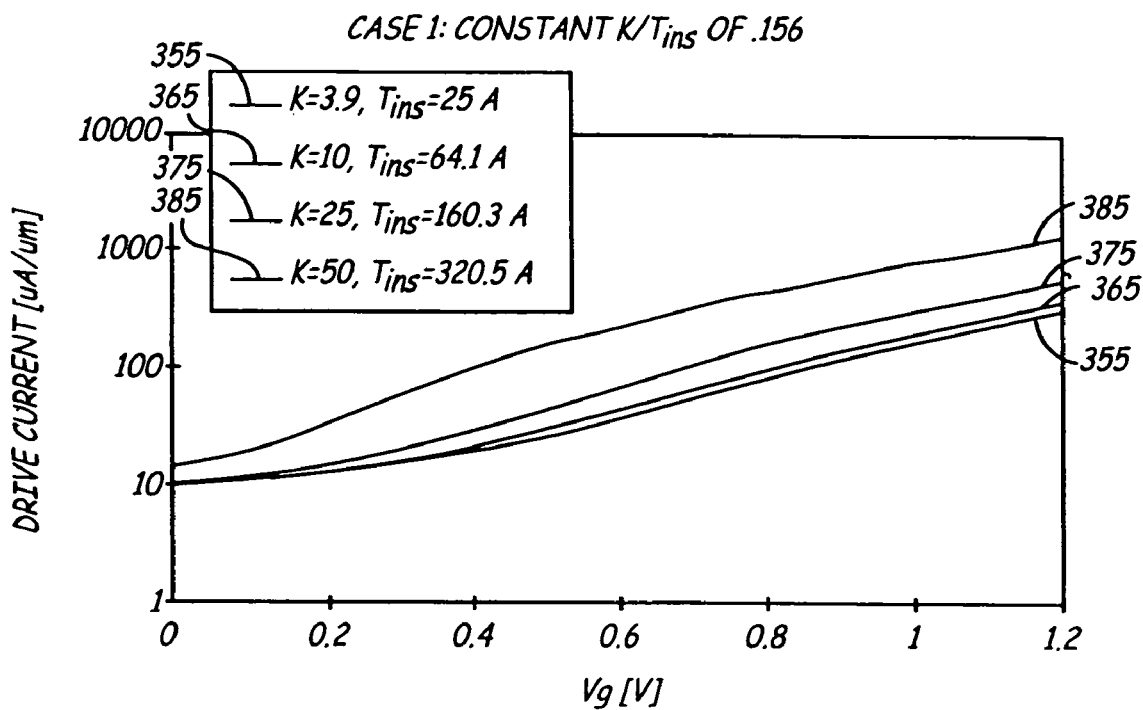
FIG. 3b is a logarithmic plot showing the simulated relationship between the drive current $I_D$ and gate voltage $V_G$ for various K values, with the ratio $K/T_{ins}$ held constant.
Figure 3C:
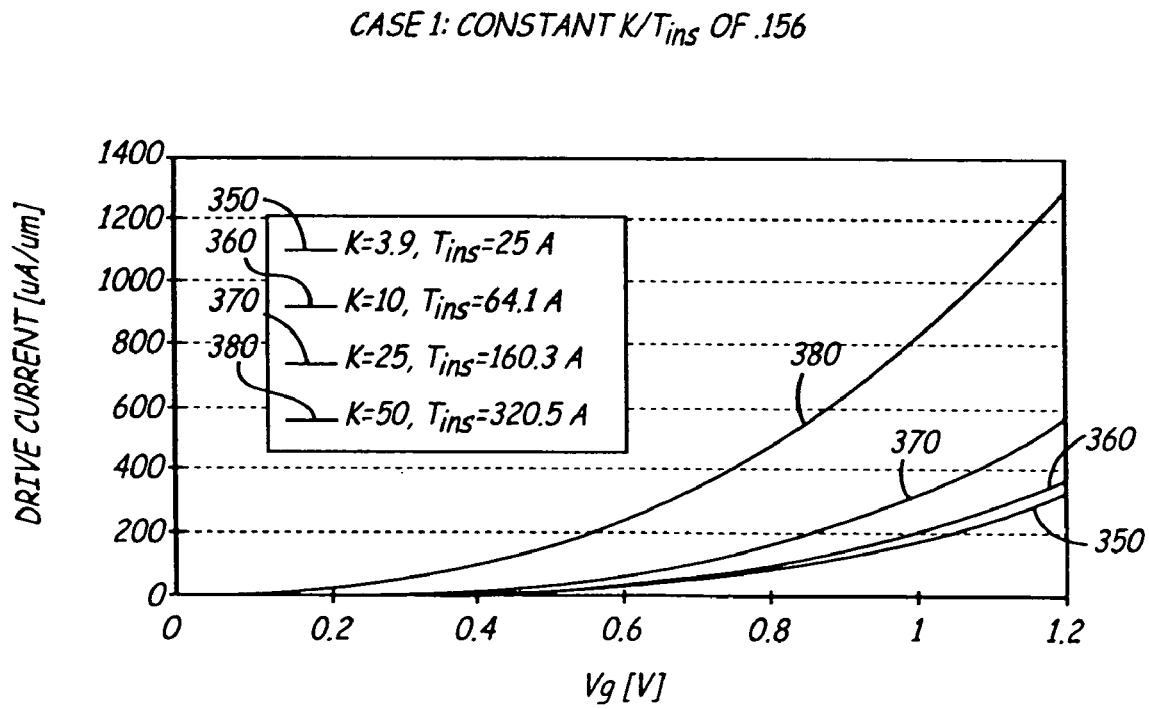
FIG. 3c is a linear plot with the same data as FIG. 3b.

Referring to FIGS. 3a-c, full two dimensional electrostatic simulations were performed on the MOSFET device 305 structure of FIG. 3a, for various insulating layer 309 thicknesses $T_{ins}$ 307 and insulator dielectric constants K. The simulation assumes the following:

1) P type MOS semiconductor device 305, metallic source 301/drain 303 at 300K.

2) Metallic source 301/drain 303 with radius of curvature R 311 of 10 nm.

3) Channel length L 313 of 25 nm, drain voltage $V_D$ of 1.2V.

4) No significant charge, either fixed or mobile, in the silicon substrate 315.

5) The drain current, $I_D$, is limited solely by the emission process at the source 301 end of the semiconductor device 305.

6) The current density versus electric field (J vs. E) characteristic for the emission process at the source 301 is modeled after a platinum silicide-to-silicon Schottky contact. The Schottky barrier height is assumed to be 0.187 eV, hole effective mass in the silicon is 0.66 mo, fermi level is at 5.4 eV, and temperature is 300K. For a given electric field strength at a particular point on the source 301, the current density is calculated via a complete, no approximations solution to the Schroedinger equation assuming a 1-D sharp triangular barrier. The effects of quantum tunneling and reflection have been fully included. Because the total current density is integrated across the density of states, currents due to field emission, thermal emission, and thermally assisted field emission have been accounted for. The J vs. E relationship has been calibrated to experimental data for the pure thermal emission case (E=0).

These assumptions are valid in the real world case of short channel (<25 nm) and undoped (or lightly doped) substrates. Although the absolute values of the calculated source 301 emission currents have not been calibrated for E>0, they are based on some experimental data and first-principles calculations. For the purposes of the proposed invention, the calculated J vs. E data is sufficient as the primary interest relates to the effect of the insulating layer 309 thickness ($T_{ins}$) 307 and dielectric constant (K) on source 301 emission current. Relative changes in source 301 emission current with $T_{ins}$ and K are more relevant, in this case, than the absolute value of the current. Nevertheless, calculated values of both leakage and drive currents $I_D$ are in good agreement with the measured data of actual transistors.

Simulations were run with a constant $K/T_{ins}$ ratio of 0.156. The results are shown in FIGS. 3b-c. Starting with FIG. 3b, working upwards, curve 350 shows the relationship between the gate voltage $V_G$ and the drive current $I_D$ in a semiconductor device with an insulating layer dielectric constant of 3.9 ($T_{ins}$=25 Å). Curves 360, 370 and 380 show the ratio of $V_G$ and $I_D$ in semiconductor devices with sources 220 and drains 230 that form a Schottky contact or Schottky-like region 270, 275 with the substrate and insulating dielectric constants of 10 ($T_{ins}$=64.1 Å), 25 ($T_{ins}$=160.3 Å), and 50 ($T_{ins}$=320.5 Å), respectively. Referring to FIG. 3b, curve 355 shows the logarithmic relationship between the gate voltage $V_G$ and the drive current $I_D$ in a semiconductor device with an insulating layer dielectric constant of 3.9 ($T_{ins}$=25 Å). Curves 365, 375 and 385 show the logarithmic ratio of $V_G$ and $I_D$ in semiconductor devices with sources 220 and drains 230 that form a Schottky contact or Schottky-like region 270, 275 with the substrate and insulating dielectric constants of 10 ($T_{ins}$=64.1 Å), 25 ($T_{ins}$=160.3 Å), and 50 ($T_{ins}$=320.5 Å), respectively. It is expected that similar results would be achieved regardless of the radius of curvature R 311, channel length 313 and drain voltage $V_D$. Drive current to leakage current ratios are 35, 38, 53 and 86 for the curves 350/355, 360/365, 370/375 and 380/385, respectively. Leakage currents can be lowered by at least a factor of 10, without sacrificing drive currents, by the addition of the appropriate dopants in the substrate (to control bulk-punchthrough currents) or by a reduction in operating temperature. Thus, by using a source 301 or drain 303 that forms a Schottky contact or Schottky-like region with the substrate, and by increasing K while maintaining a constant $K/T_{ins}$ ratio, the drive current $I_D$ increases significantly (from a little over 300 μA/μm for a $V_G$ of 1.2V to approximately 1300 μA/μm). Thus, for a desired drive current, a device would need a significantly lower voltage to operate than that required by the prior art. Because power consumption varies with the square of the voltage, the invention provides for significantly lower power usage.

Figure 4A:
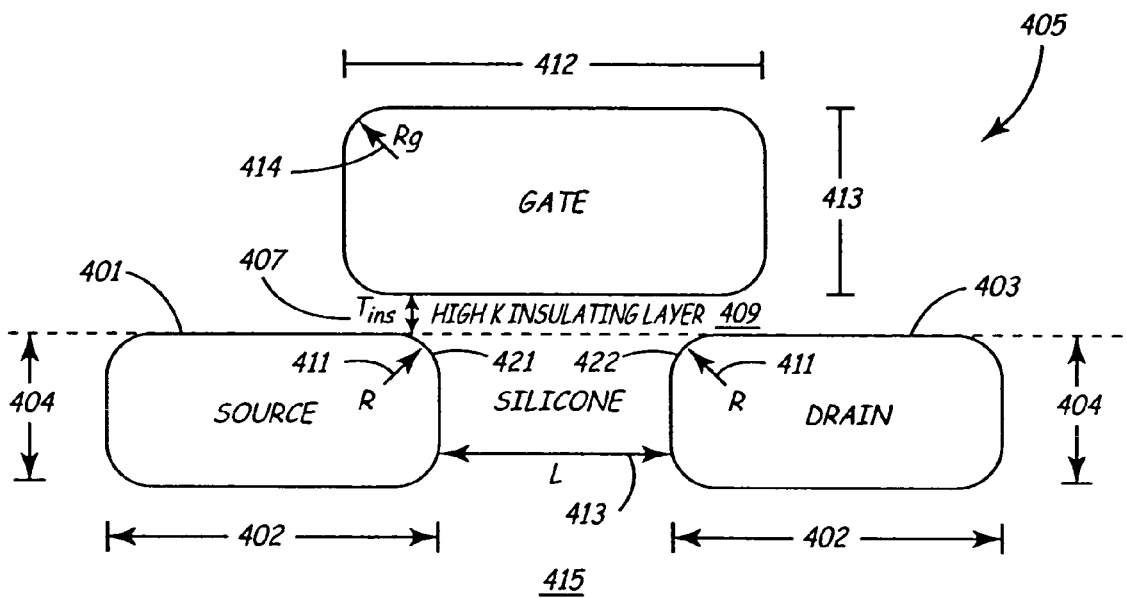
FIG. 4a is a cross-section of a semiconductor device with Schottky contact source and drain combined with a non-silicon dioxide insulating layer between the gate and channel region. This is the device structure used for a second set of numerical simulations.
Figure 4B:
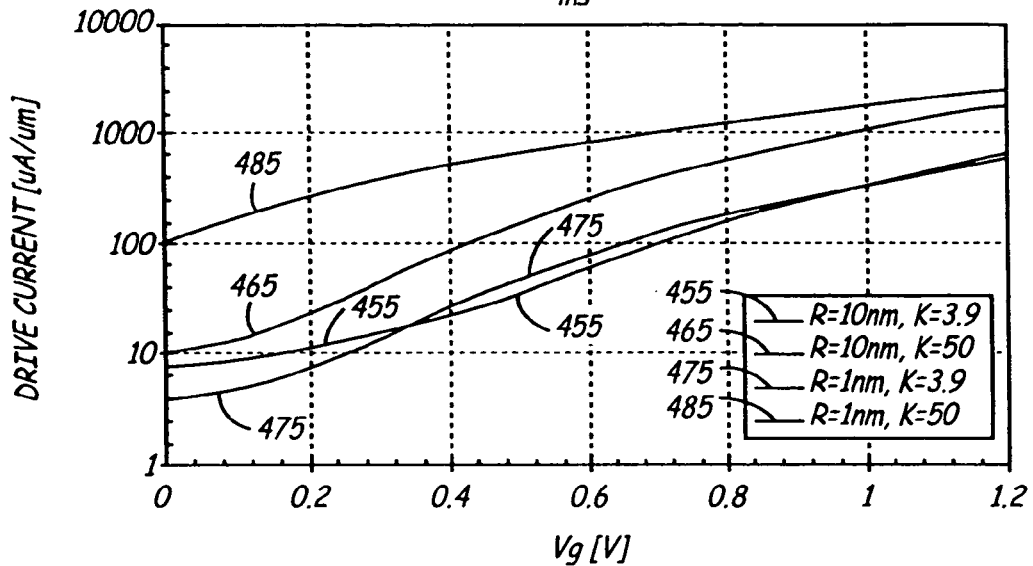
FIG. 4b is a logarithmic plot showing the simulated relationship between the drive current $I_D$ and gate voltage $V_G$ for various K values, with the ratio $K/T_{ins}$ held constant.
Figure 4C:
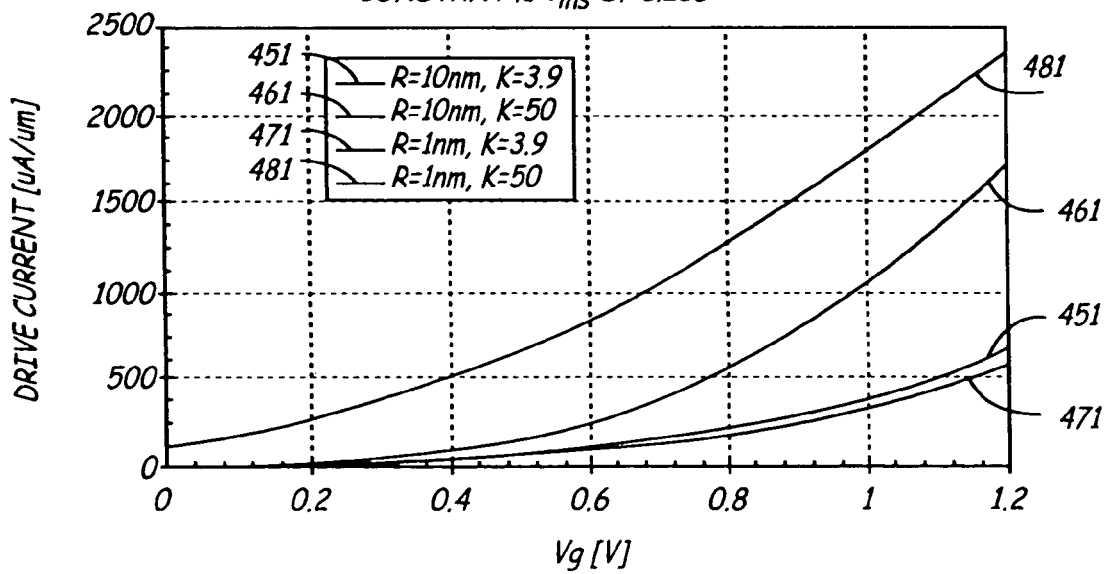
FIG. 4c is a linear plot with the same data as FIG. 4b.

To verify that changing the radius of curvature R 311 does not change the observed dramatic improvement in $I_D$, full 2-D electrostatic simulations were repeated on a slightly different device geometry. Referring to FIGS. 4a-c, the semiconductor device 405 structure of FIG. 4a was simulated for two insulating layer 409 thicknesses $T_{ins}$ 407 and insulator dielectric constants K, such that the ratio $K/T_{ins}$ was constant. The simulation assumptions are the same as noted above, with the exception of the device geometry:

1) The channel length L 413 is 27 nm
2) The width 402 and height 404 of the source and drain are 100 nm and 30 nm respectively.
3) The width 412 and height 413 of the gate are 67 nm and 108 nm respectively.
4) The radius of curvature $R_g$ 414 of the gate was 10 nm for all simulations.
5) The radius of curvature R 411 of the source and drain electrodes was either 1 nm or 10 nm.

Simulations were run with a constant $K/T_{ins}$ ratio of 0.205. The results are shown in FIGS. 4b-c. Starting with FIG. 4c, curves 451 and 461 show the relationship between the gate voltage Vg and the drive current $I_D$ in a semiconductor device having a radius of curvature R 411 of 10 nm with an insulating layer dielectric constant of 3.9 ($T_{ins}$=25 Å) and 50 ($T_{ins}$=244 Å), respectively. Continuing with FIG. 4c, curves 471 and 481 show the relationship between the gate voltage Vg and the drive current $I_D$ in a semiconductor device having a radius of curvature R 411 of 1 nm with an insulating layer dielectric constant of 3.9 ($T_{ins}$=25 Å) and 50 ($T_{ins}$=244 Å), respectively. Referring to FIG. 4b, curves 455 and 465 show the logarithmic relationship between the gate voltage Vg and the drive current $I_D$ in a semiconductor device having a radius of curvature R 411 of 10 nm with an insulating layer dielectric constant of 3.9 ($T_{ins}$=25 Å) and 50 ($T_{ins}$=244 Å), respectively. Continuing with FIG. 4b, curves 475 and 485 show the relationship between the gate voltage Vg and the drive current ID in a semiconductor device having a radius of curvature R 411 of 1 nm with an insulating layer dielectric constant of 3.9 ($T_{ins}$=25 Å) and 50 ($T_{ins}$=244 Å), respectively. FIGS. 4b-c show that by using a source 401 or drain 403 that forms a Schottky contact or Schottky-like region with the substrate, and by increasing K while maintaining a constant $K/T_{ins}$ ratio, the drive current $I_D$ increases significantly (from approximately 650 mA/mm for a Vg of 1.2V to approximately 1700 mA/mm) for a device having a radius of curvature R 411 of 10 nm. The ratio of drive currents for the K=50 to the K=3.9 case is 1700/650=2.6. Likewise, for the device having a radius of curvature R 411 of 1 nm, the drive current $I_D$ increases significantly (from approximately 570 mA/mm for a Vg of 1.2V to approximately 2340 mA/mm). In this case, the ratio of drive current for the K=50 to the K=3.9 case is 2340/570=4.1. These results indicate that the relative improvement in drive current $I_D$ grows larger for smaller radii of curvature R 411. Further, these results indicate that increasing the ratio $K/T_{ins}$ will lead to larger improvements in drive current Id as compared to the case of constant $K/T_{ins}$. A conventional impurity doped source and drain device would have approximately the same drive current $I_D$ for both K=3.9 and K=50 cases having constant $K/T_{ins}$.

Cross sectional scanning electron micrographs of the source and drain corner regions indicate that the radius of curvature R 411 for the top corner of the source 421 and top corner of the drain 422 electrode adjacent to the channel region are closer to 1 nm, rather than 10 nm. The simulation predictions of FIGS. 4a-c indicate that for a desired drive current, by using a source 401 or drain 403 that forms a Schottky contact or Schottky-like region with the substrate, and by using high K dielectric gate insulator materials, the device would need a significantly lower voltage to operate than that required by the prior art. Because power consumption varies with the square of the voltage, the invention provides for significantly lower power usage.

Figure 5:
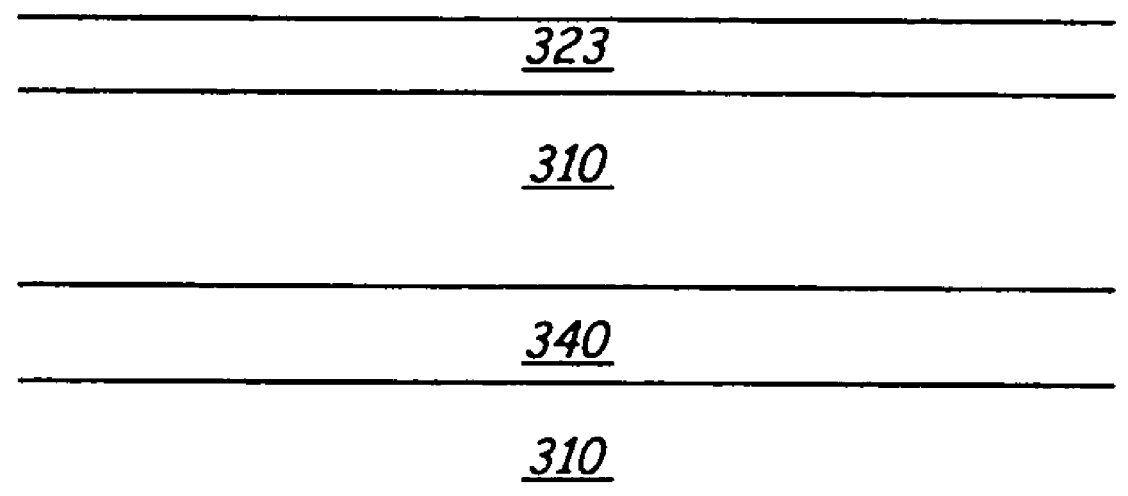
Figure 8:
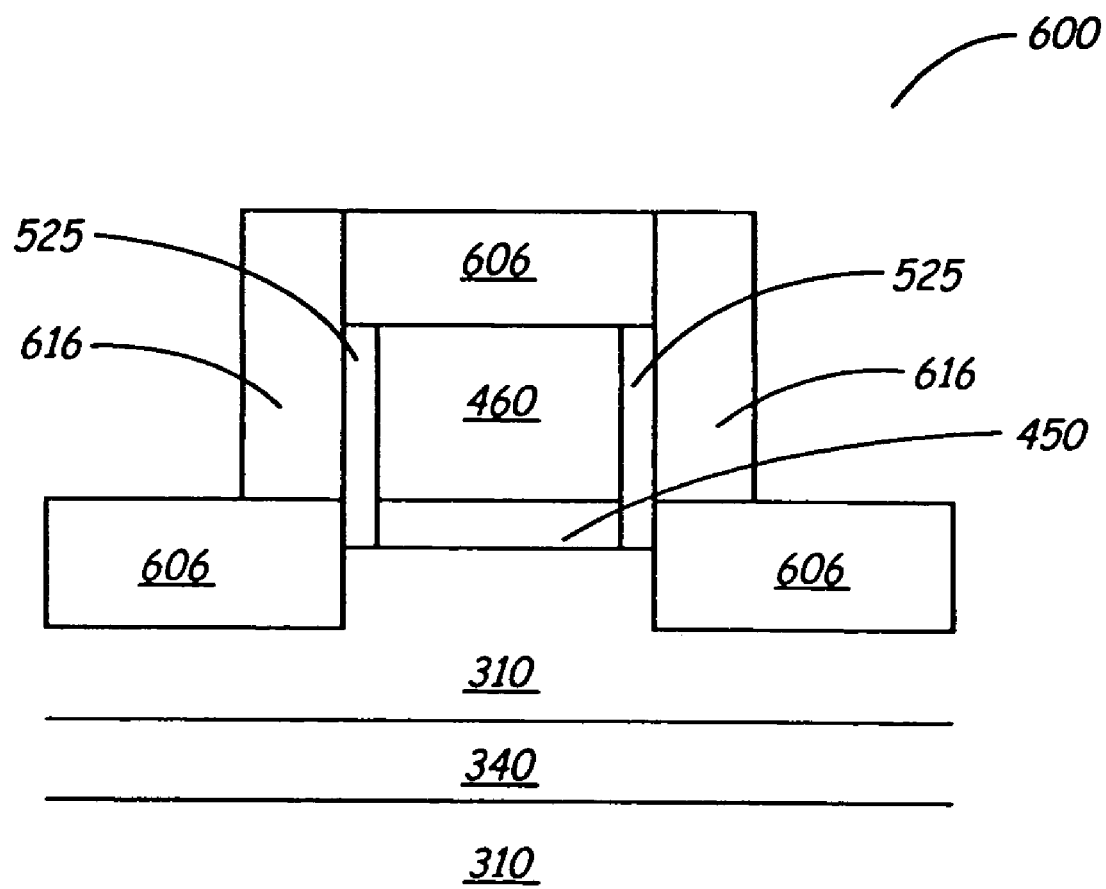
FIG. 8 is a cross-section of semiconductor substrate after creation of a metal silicide source and drain.
Figure 9:
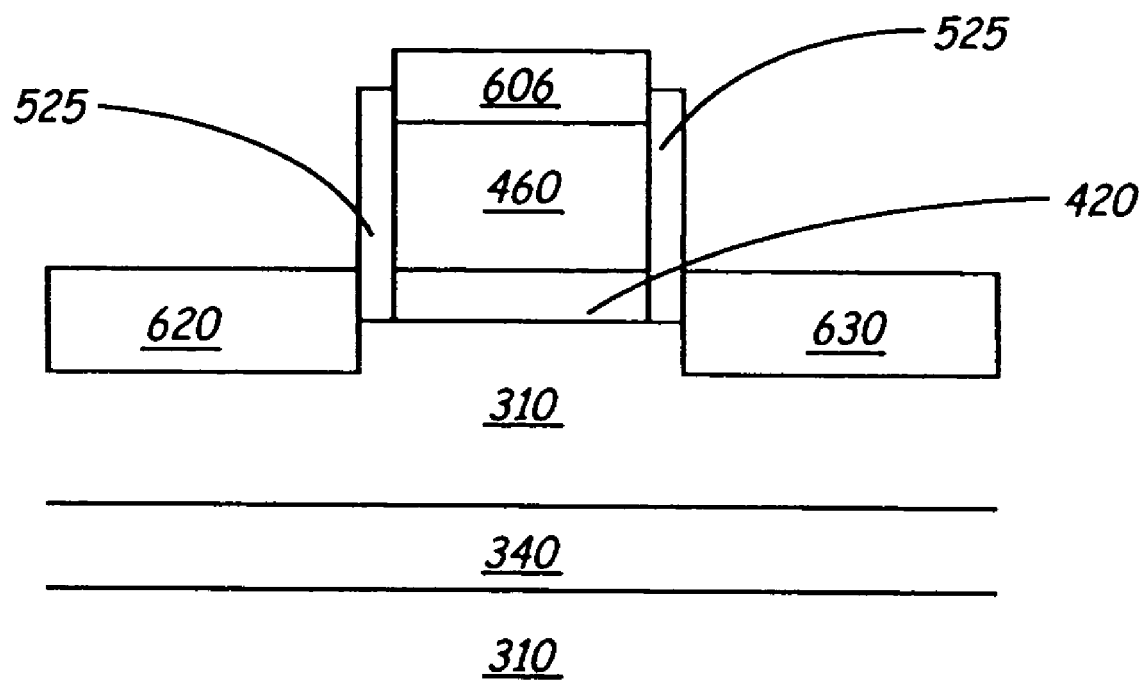
FIG. 9 is a cross-section of the semiconductor device resulting from the process steps outlined in FIG. 10.
Figure 10:
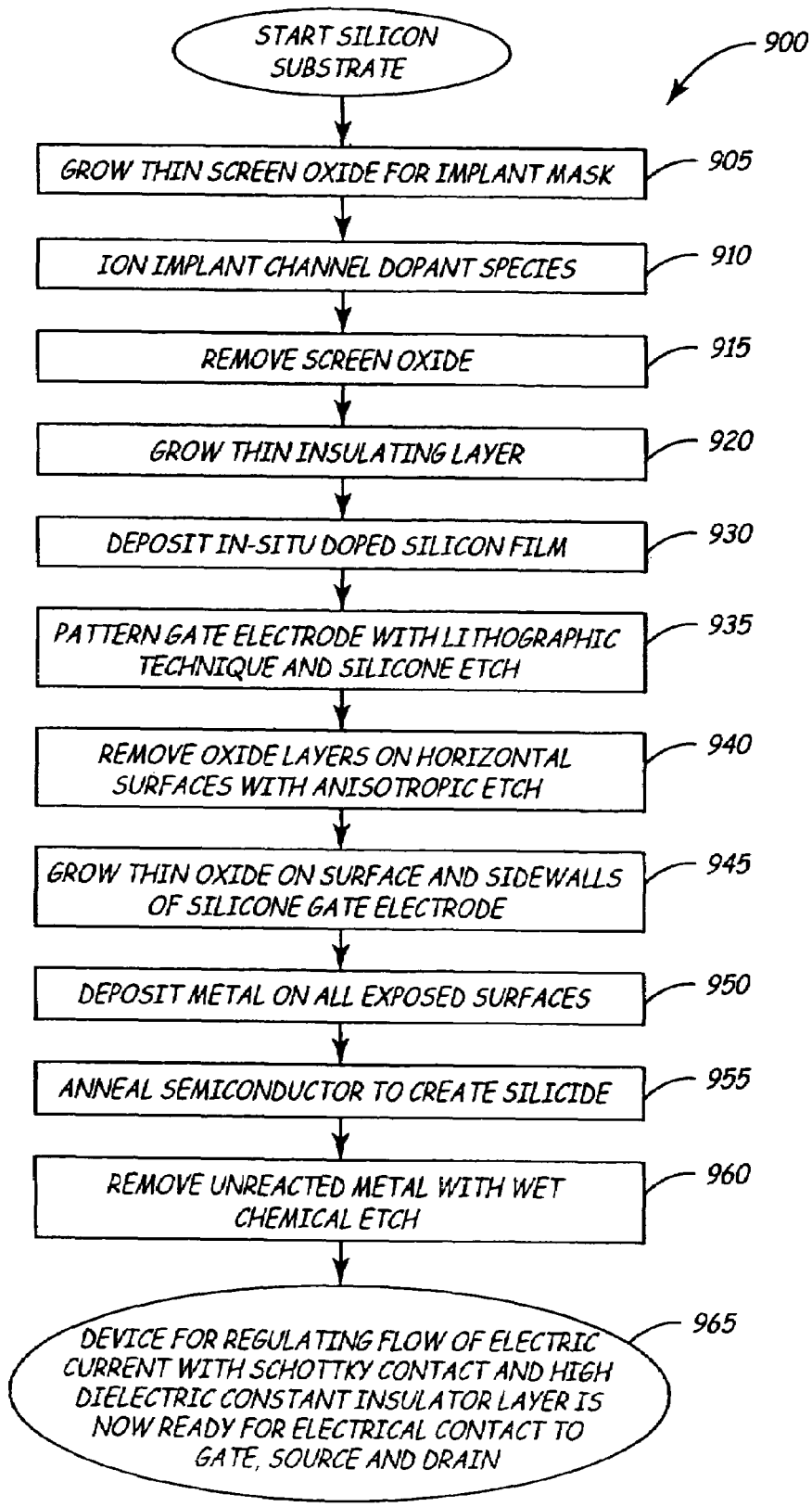
FIG. 10 is a flow chart outlining the process flow for the fabrication of a device for regulating flow of electric current in accordance with the invention.

The device for regulating flow of electric current described above, for example a planar P-type or N-type MOSFET, may be formed using the process shown in FIGS. 5-9 and described in FIG. 10. (Note that the planar P-type or N-type MOSFET need not be planar in the horizontal direction, but may assume any planar orientation.) Referring to FIGS. 5 and 10, a thin screen oxide 323 is grown on silicon substrate 310, the substrate 310 having a means for electrically isolating transistors from one another (905). The thin screen oxide, optionally a thickness of 200 Å, acts as the implant mask for the channel region 340 doping. The appropriate channel dopant species (for example Arsenic and Indium for P-type and N-type devices respectively) is then ion-implanted through the screen oxide 323 to a pre-determined depth in the silicon (for example, 1000 Å) (910).

Figure 6:
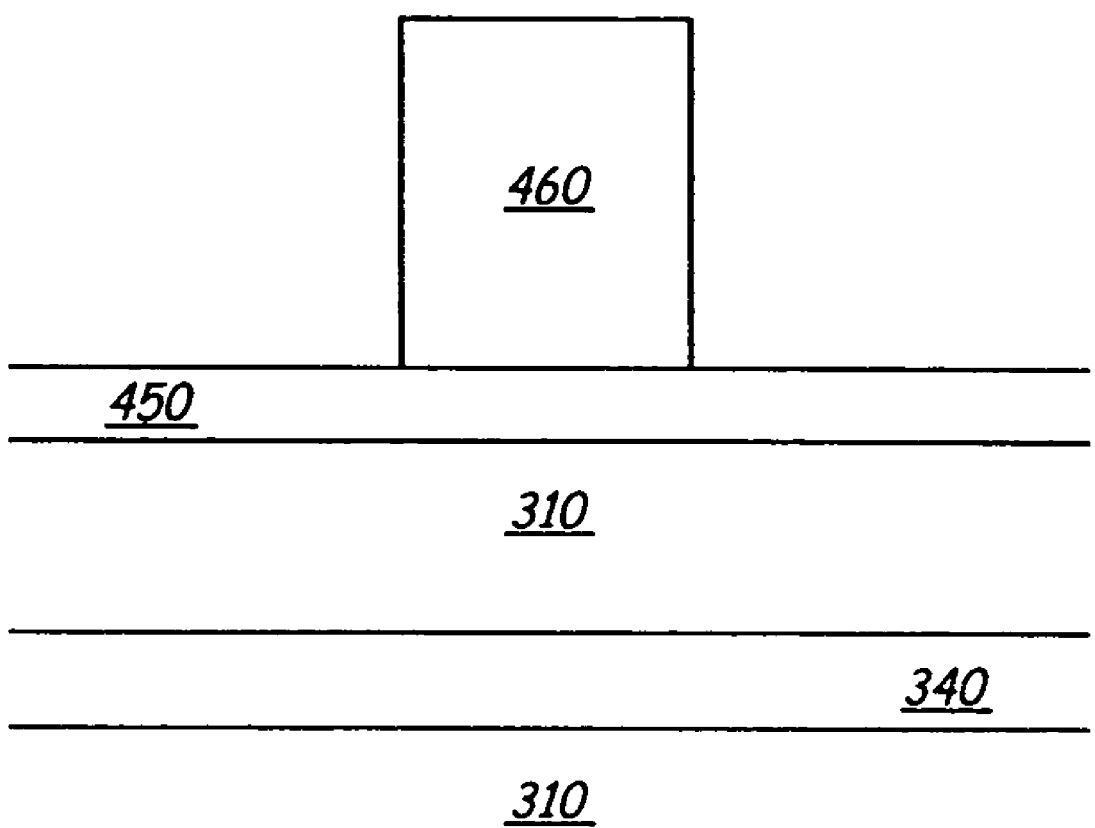
FIG. 6 is a cross-section of semiconductor substrate after insulating layer growth and gate patterning.

Referring to FIGS. 6 and 10, the screen oxide layer 323 of FIG. 5 is removed with hydro-fluoric acid (915), and the thin insulating layer 450 is either grown or deposited at least on a portion of the channel region 340 (920). This insulating layer may consist of $TiO_2$, $TaO_2$, or any other appropriate compound with a high dielectric constant as discussed above. Immediately following the insulating layer growth or deposition, an in-situ heavily doped silicon film is deposited (930). This silicon film will eventually make up the gate electrode. The silicon film may be doped with phosphorus for an N-type device or boron for a P-type device. The gate electrode is then patterned with a lithographic technique and silicon etch that is highly selective to the insulating layer 450 (935).

Figure 7:
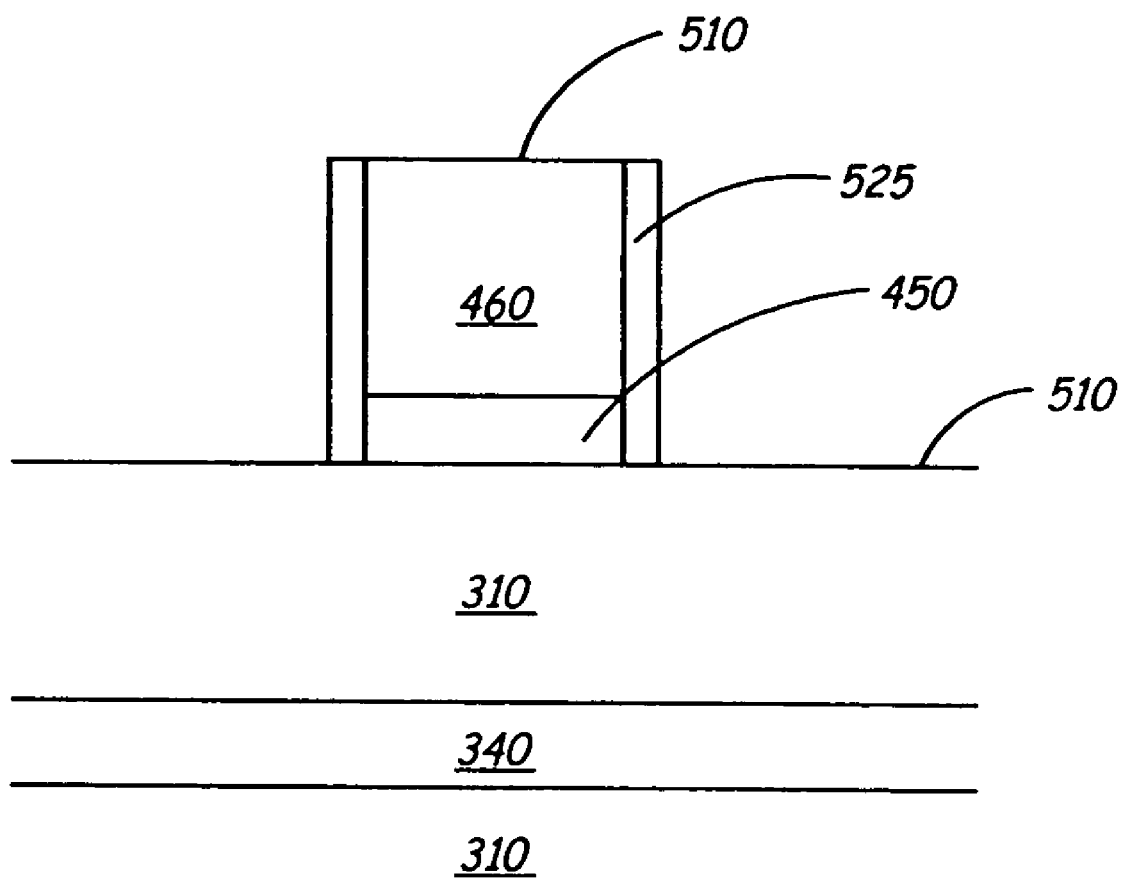
FIG. 7 is a cross-section of semiconductor substrate after growth of an oxide layer on the sidewalls.

Referring to FIGS. 7 and 10, a thin oxide, optionally approximately 100 Å in thickness, is formed on the top surface and sidewalls of the gate electrode (940). Some of the oxide layers then are removed by anisotropic etch to expose the silicon on the horizontal surfaces 510, while preserving it on the vertical surfaces (945). This step serves both to create a gate sidewall oxide 525 and to electrically activate the dopants in the gate electrode and channel region 340 of the device.

Referring to FIGS. 8 and 10, a metal is deposited as a blanket film, optionally approximately 400 Å thick, on all surfaces (950). The particular metal deposited will depend on whether the device is N-type or P-type. Platinum may be used for the P-type device while erbium may be used for an N-type device. The semiconductor device 600 is then annealed for a specified time at a specified temperature, for example, 45 minutes at 400° C. (955). This temperature is much less the temperature typically required to form impurity doped source and drains, which is usually greater than 800° C. Where the metal is in direct contact with the silicon, the annealing process causes a chemical reaction that converts the metal to a metal silicide 606. The metal 616 not in contact with silicon does not react.

Referring to FIGS. 9 and 10, the unreacted metal 616 is removed with a wet chemical etch (960). For example, if the deposited metal was platinum or erbium, aqua regia or HNO3, respectively, may be used to remove it. The silicide electrodes that remain are the source 620 and drain 630. The Schottky device for regulating flow of electric current with a high dielectric constant insulating layer is now complete and ready for electrical contacting to gate electrode 460, source 620, and drain 630 (965). Because the temperature required to form the Schottky or Schottky-like source and drain electrodes in this process is much lower then that required for impurity doped source 620 and drain 630 regions, the high K material used for the gate insulator 450 is much less likely to react with neighboring materials, making this process much more manufacturable than the prior art.

A number of embodiments of the invention have been described. Nevertheless, it will be understood that various modifications may be made without departing from the spirit and scope of the invention. For example, the semiconductor devices illustrated in the claims are by way of example only. It should be understood that the concepts of the invention apply to semiconductor devices with a variety of cross-sections. And, although the invention has been illustrated with respect to planar silicon MOS transistors, it can apply equally well to other devices for regulating the flow of electrical current. For example, devices built on other semiconductor substrates such as gallium arsenide GaAs, indium phosphide InP, silicon carbide SiC, silicon germanium SiGe, etc. Further, the device is not required to have any particular radius of curvature for the source and drain electrode corners. And, the invention is not limited to any particular ratio(s) of $K/T_{ins}$. Accordingly, other embodiments are within the scope of the following claims.

Although the present invention has been described with reference to preferred embodiments, persons skilled in the art will recognize that changes may be made in form and detail without departing from the spirit and scope of the invention.

We claim:

1. A method for manufacture of a device for regulating a flow of electrical current, the method comprising:

providing for a semiconductor substrate having a first surface region having a first polarity type;

forming an electrically insulating layer in contact with a surface of the first surface region of the semiconductor substrate, the insulating layer having a dielectric constant greater than 4.0;

forming a gate electrode located in contact with at least a portion of the insulating layer;

exposing the first surface region of the semiconductor substrate on one or more areas proximal to the gate electrode;

forming a thin film of metal on at least a portion of the exposed first surface region of the semiconductor substrate; and reacting the metal with the first surface region of the semiconductor substrate such that a Schottky or Schottky-like source electrode and drain electrode are formed on the semiconductor substrate, wherein the formed source electrode and drain electrode are in contact with the first polarity type of the first surface region, and wherein an electrically controlled channel region is formed in the first surface region of the substrate on a side of the electrically insulating layer opposite the gate electrode under control of a voltage on the gate electrode, wherein the electrically controlled channel region has a second polarity type opposite the first polarity type of the first surface region, and wherein the electrically controlled channel region is formed under control of the voltage on the gate electrode adjacent to and touching at least one of the source electrode and the drain electrode.

2. The method of claim 1, wherein the gate electrode is provided by:

depositing a thin conducting film on the insulating layer;

patterning and etching the conducting film to form a gate electrode; and forming one or more thin insulating layers on one or more sidewalls of the gate electrode.

3. The method of claim 1, further comprising removing metal not reacted during the reacting process.

4. The method of claim 1, wherein the reacting comprises thermal annealing.

5. The method of claim 1, wherein the source and drain electrodes are formed from a member of the group consisting of: platinum silicide, palladium silicide and iridium silicide.

6. The method of claim 1, wherein the source and drain electrodes are formed from a member of the group consisting of the rare earth silicides.

7. The method of claim 1, wherein the insulating layer is formed from a member of the group consisting of metal oxides.

8. The method of claim 1, wherein the insulating layer is formed from an oxy-nitride stack.

9. The method of claim 1, wherein the Schottky contact or Schottky-like region is formed at least in areas adjacent to the channel.

10. The method of claim 1, wherein an entire interface between the semiconductor substrate and at least one of the source electrode and the drain electrode forms a Schottky contact or Schottky-like region.

11. The method of claim 1, wherein dopants are introduced into the channel region.

12. The method of claim 1, wherein the insulating layer has the dielectric constant greater than 7.6.

13. The method of claim 1, wherein the insulating layer has the dielectric constant greater than 15.

14. The method of claim 1, wherein the metal includes platinum.

15. The method of claim 1, wherein the metal includes palladium.

16. The method of claim 1, wherein the metal includes iridium.

17. The method of claim 1, wherein the metal is platinum.

18. The method of claim 1, wherein the metal is palladium.

19. The method of claim 1, wherein the metal is iridium.

20. The method of claim 1, wherein the metal is a member of the group consisting of the rare earth silicides.

21. The method of claim 1, wherein the insulating layer includes a hafnium oxide.

22. The method of claim 1, wherein the insulating layer includes a tantalum oxide.

23. The method of claim 1, wherein the insulating layer includes a zirconium oxide.

24. The method of claim 1, wherein the insulating layer includes a silicon oxy-nitride.

25. The method of claim 1, wherein the insulating layer includes SiON.

26. The method of claim 1, wherein the insulating layer includes yttrium oxide.

27. The method of claim 1, wherein the insulating layer includes lanthanum oxide.

28. The method of claim 1, wherein the insulating layer includes gadolinium oxide.

29. The method of claim 1, wherein the insulating layer includes scandium oxide.

30. The method of claim 1, wherein the insulating layer includes zirconium silicate.

31. The method of claim 1, wherein the insulating layer includes hafnium silicate.

32. The method of claim 1, wherein the insulating layer includes lanthanum silicate.

33. The method of claim 1, wherein the insulating layer includes titanium silicate.

34. The method of claim 1, wherein the insulating layer includes lanthanum aluminate.

35. The method of claim 1, wherein the insulating layer includes zirconium titanate.

36. The method of claim 1, wherein the insulating layer includes tin titanate.

37. The method of claim 1, wherein the insulating layer includes strontium zirconate.

38. The method of claim 1, wherein the insulating layer includes $LaAl_3O_4$.

39. The method of claim 1, wherein the insulating layer includes barium zirconate.

40. The method of claim 1, wherein the insulating layer has a dielectric constant of approximately 25.

41. The method of claim 1, wherein the insulating layer has a dielectric constant of 5-10.

42. The method of claim 1, wherein the insulating layer has a dielectric constant of 10-20.

43. The method of claim 1, wherein the insulating layer has a dielectric constant of greater than 20.

44. The method of claim 1, wherein the insulating layer has a dielectric constant of approximately 15-20.

45. The method of claim 1, wherein the insulating layer has a dielectric constant of approximately 50-60.

46. The method of claim 1, further comprising removing at least a portion of the metal not reacted during the reacting process.

47. The method of claim 1, wherein the insulating layer includes a plurality of layers.

48. The method of claim 47, wherein the plurality of layers includes a first insulating material with a first dielectric constant and a second insulating material with a second dielectric constant, wherein the second insulating material is located on top of the first insulating material.

49. The method of claim 47, wherein the plurality of layers includes a first insulating material with a first dielectric constant and a second insulating material with a second dielectric constant, wherein the second insulating material is located on top of the first insulating material, and wherein the first material with the first dielectric constant includes silicon nitride and the second insulating material with the second dielectric constant includes titanium oxide.

50. The method of claim 11, wherein the dopants have a dopant concentration that is substantially uniform in a first direction along a vector that is parallel to the surface of the first surface region, but varies in a second direction along a vector that is normal to the surface of the first surface region.

51. The method of claim 11, wherein the dopants have a dopant concentration that varies in both a first direction along a vector that is parallel to the surface of the first surface region and in a second direction along a vector that is normal to the surface of the first surface region.

52. The method of claim 1, wherein an entire interface between the semiconductor substrate and the source electrode forms a Schottky contact or Schottky-like region.

53. A method for manufacture of a device for regulating a flow of electrical current, the method comprising:
providing for a semiconductor substrate having a first surface region having a first polarity type;
forming an electrically insulating layer in contact with the semiconductor substrate, the insulating layer having a dielectric constant greater than 4.0;
forming a gate electrode located in contact with at least a portion of the insulating layer;
exposing the first surface region of the semiconductor substrate on one or more areas proximal to the gate electrode;
forming a thin film of metal on at least a portion of the exposed first surface region of the semiconductor substrate; and
reacting the metal with the first surface region of the semiconductor substrate such that a Schottky source electrode and a Schottky drain electrode are formed in the semiconductor substrate, wherein the formed source electrode and drain electrode are in direct contact with the first polarity type of the first surface region, and wherein an electrically controlled channel region is formed in the first surface region of the substrate on a side of the electrically insulating layer opposite the gate electrode under control of a voltage on the gate electrode, wherein the electrically controlled channel region has a second polarity type opposite the first polarity type, and wherein the electrically controlled channel region formed under control of the voltage on the gate electrode is adjacent to and touching at least one of the source electrode and the drain electrode.

* * * * *